US011856786B2

(12) United States Patent
Young et al.

(10) Patent No.: US 11,856,786 B2
(45) Date of Patent: Dec. 26, 2023

(54) INTEGRATED CIRCUIT INCLUDING THREE-DIMENSIONAL MEMORY DEVICE

(71) Applicant: Taiwan Semiconductor Manufacturing Company, Ltd., Hsinchu (TW)

(72) Inventors: Bo-Feng Young, Taipei (TW); Yi-Ching Liu, Hsinchu (TW); Sai-Hooi Yeong, Hsinchu County (TW); Yih Wang, Hsinchu (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 200 days.

(21) Appl. No.: 17/347,596

(22) Filed: Jun. 15, 2021

(65) Prior Publication Data
US 2022/0278128 A1 Sep. 1, 2022

Related U.S. Application Data

(60) Provisional application No. 63/153,965, filed on Feb. 26, 2021.

(51) Int. Cl.
*H10B 51/40* (2023.01)
*H10B 51/20* (2023.01)
(Continued)

(52) U.S. Cl.
CPC .......... *H10B 51/40* (2023.02); *G11C 11/2257* (2013.01); *H01L 23/5226* (2013.01);
(Continued)

(58) Field of Classification Search
CPC ........ H10B 51/40; H10B 51/20; H10B 43/50; H10B 51/50; H10B 43/40; H10B 43/30;
(Continued)

(56) References Cited

U.S. PATENT DOCUMENTS 10,475,879 B1 11/2019 Pachamuthu et al.
10,847,526 B1 * 11/2020 Yip ..................... H10B 41/27
(Continued)

FOREIGN PATENT DOCUMENTS

TW 201834147 9/2018

OTHER PUBLICATIONS

"Office Action of Taiwan Counterpart Application", dated Apr. 8, 2022, p. 1-p. 3.
"Office Action of Germany Counterpart Application", dated Nov. 4, 2021, p. 1-p. 8.

*Primary Examiner* — David Vu
*Assistant Examiner* — Brandon C Fox
(74) *Attorney, Agent, or Firm* — JCIPRNET

(57) ABSTRACT

An integrated circuit is provided. The integrated circuit includes a three-dimensional memory device, a first word line driving circuit and a second word line driving circuit. The three-dimensional memory device includes stacking structures separately extending along a column direction. Each stacking structure includes a stack of word lines. The stacking structures have first staircase structures at a first side and second staircase structures at a second side. The word lines extend to steps of the first and second staircase structures. The first and second word line driving circuits lie below the three-dimensional memory device, and extend along the first and second sides, respectively. Some of the word lines in each stacking structure are routed to the first word line driving circuit from a first staircase structure, and others of the word lines in each stacking structure are routed to the second word line driving circuit from a second staircase structure.

20 Claims, 12 Drawing Sheets

(51) Int. Cl.
*G11C 11/22* (2006.01)
*H01L 23/522* (2006.01)
*H10B 43/40* (2023.01)
*H10B 43/50* (2023.01)
*H10B 51/30* (2023.01)
*H10B 51/50* (2023.01)
*H10B 43/30* (2023.01)

(52) U.S. Cl.
CPC ............. *H10B 43/30* (2023.02); *H10B 43/40* (2023.02); *H10B 43/50* (2023.02); *H10B 51/20* (2023.02); *H10B 51/30* (2023.02); *H10B 51/50* (2023.02)

(58) Field of Classification Search
CPC .. H10B 51/30; G11C 11/2257; H01L 23/5226
See application file for complete search history.

(56) References Cited

U.S. PATENT DOCUMENTS

| | | |
|---|---|---|
| 2011/0244666 A1 | 10/2011 | Kim et al. |
| 2017/0179028 A1* | 6/2017 | Lee .................. H10B 43/35 |
| 2017/0352678 A1 | 12/2017 | Lu et al. |
| 2018/0211967 A1* | 7/2018 | Shimojo ............ H10B 43/10 |
| 2018/0301374 A1 | 10/2018 | Masamori et al. |
| 2018/0374865 A1 | 12/2018 | Shimabukuro et al. |
| 2019/0287903 A1* | 9/2019 | Yoshinaga ........... H10B 43/27 |
| 2020/0066703 A1 | 2/2020 | Kim et al. |
| 2020/0266146 A1 | 8/2020 | Nishida |
| 2022/0139950 A1* | 5/2022 | Guo .................. H10B 41/27 257/314 |
| 2023/0005863 A1* | 1/2023 | Yang ................. H01L 24/80 |

* cited by examiner

INTEGRATED CIRCUIT INCLUDING THREE-DIMENSIONAL MEMORY DEVICE

This application claims the priority benefit of U.S. provisional application Ser. No. 63/153,965, filed on Feb. 26, 2021. The entirety of the above-mentioned patent application is hereby incorporated by reference herein and made a part of this specification.

BACKGROUND

In the past decades, growing demand for data storage has led to continuously scaling of non-volatile memory, and to development of cells in the non-volatile memory from single-level cells (SLCs) to multi-level cells (MLCs). However, these solutions are limited by the confines of two-dimensional design. All of the cells in the non-volatile memory are lined up next to each other in a string, but there is only one level of cells. This ultimately limits the capacity that the non-volatile memory could offer.

Three-dimensional memory is a new evolution that solves some of the problems with storage capacity of the non-volatile memory. By stacking cells vertically, it is possible to dramatically increase the storage capacity without significantly increasing footprint area of the non-volatile memory. However, as the storage capacity of three-dimensional memory continuously grows, interconnection between the three-dimensional memory and the driving devices becomes much more complicated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
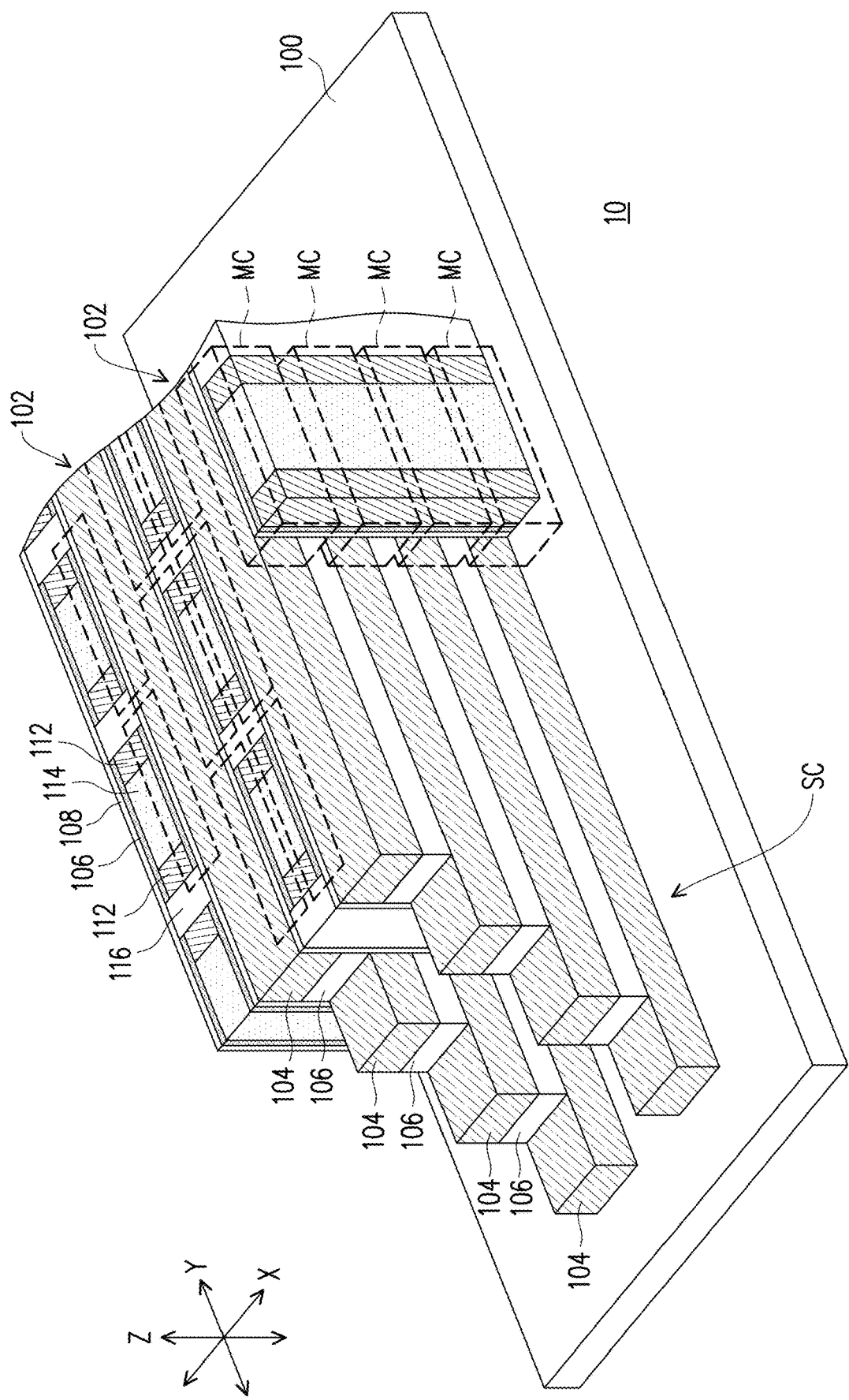
FIG. 1A is a three-dimensional view schematically illustrating a portion of a three-dimensional device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a three-dimensional view schematically illustrating a portion of a three-dimensional memory device 10, according to some embodiments of the present disclosure.

Referring to FIG. 1A, the memory device 10 is a three-dimensional memory device, and includes stacks of memory cells MC formed on a base layer 100. In some embodiments, the base layer 100 is an etching stop layer over a semiconductor substrate (not shown), such as a semiconductor wafer or a semiconductor-on-insulator (SOI) wafer. In these embodiments, active devices (e.g., transistors) and interconnections of these active devices (both not shown) may be formed between the base layer 100 and the semiconductor wafer (or the SOI wafer).

The stacks of memory cells MC are arranged in columns respectively extending along a direction Y (also referred as a column direction). These columns are arranged along a direction X (also referred as a row direction) intersected with the direction Y. In order to clearly illustrate elements in each stack of the memory cells MC, a stack of the memory cells MC in one of these columns are particularly depicted as solely standing on the base layer 100. Although not shown, there are actually other stacks of the memory cells MC in this column. As shown in FIG. 1A, each stack of the memory cells MC include a segment of a stacking structure 102 formed on the base layer 100. A plurality of the stacking structures 102 extend along the column direction (i.e., the direction Y) and laterally spaced apart from one another along the row direction (i.e., the direction X). The stacks of the memory cells MC in the same column share the same stacking structure 102, and each stacking structure 102 may be shared by the stacks of the memory cells MC in adjacent columns.

Word lines 104 and isolation layers 106 are alternately stacked along a vertical direction Z in each stacking structure 102. A topmost layer in the stacking structure 102 may be one of the word lines 104 or one of the isolation layers 106. Similarly, a bottommost layer in the stacking structure 102 may be one of the word lines 104 or one of the isolation layers 106. Further, those skilled in the art may adjust the amount of the word lines 104 and the isolation layers 106 in each stacking structure 102, the present disclosure is not limited thereto. The word lines 104 may be formed of a conductive material, while the isolation layers 106 may be formed of an insulating material. For instance, the conductive material may include tungsten, titanium nitride, ruthenium, molybdenum, tungsten nitride or the like, whereas the insulating material may include silicon oxide, silicon nitride, silicon oxynitride or the like.

Switching layers 108 span along sidewalls of the stacking structures 102, and are in lateral contact with the word lines 104 and the isolation layers 106 in the stacking structures 102. In some embodiments, as shown in FIG. 1A, the switching layers 108 do not extend along portions of the base layer 100 between the stacking structures 102. In these embodiments, the switching layers 108 are laterally spaced apart from one another. In alternative embodiments, the switching layers 108 between adjacent ones of the stacking structures 102 are connected with each other through a portion laterally extending along a portion of the base layer 100 between these stacking structures 102. The switching layers 108 may be formed of a ferroelectric material. For instance, the ferroelectric material may include a hafnium-oxide-based material (e.g., hafnium zirconium oxide ($Hf_{1-x}Zr_xO$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium titanium oxide ($Hf_{1-x}Ti_xO$), hafnium tantalum oxide ($Hf_{1-x}Ta_xO$) or the like), barium titanate (e.g., $BaTiO_3$), lead titanate (e.g., $PbTiO_3$), lead zirconate (e.g., $PbZrO_3$), lithium niobate ($LiNbO_3$), sodium niobate ($NaNbO_3$), potassium niobate (e.g., $KNbO_3$), potassium tantalate ($KTaO_3$), bismuth scandate ($BiScO_3$), bismuth ferrite (e.g., $BiFeO_3$), aluminum scandium nitride (AlScN), the like or combinations thereof. Alternatively, the switching layer 108 may be a multilayer structure at least including a charge trapping layer sandwiched between a tunneling dielectric layer and a gate dielectric layer. For instance, the charge trapping layer may be formed of silicon oxide, while the tunneling dielectric layer and the gate dielectric layer may respectively be formed of silicon oxide.

Channel layers 110 cover sidewalls of the switching layers 108, and are in lateral contact with word lines 104 and the isolation layers 106 in the stacking structures 102 through the switching layers 108. In some embodiments, opposite sidewalls of each stacking structure 102 are respectively covered by laterally separated ones of the channel layers 110, such that each channel layer 110 may be exclusively shared by a stack of the memory cells MC. In these embodiments, cross-talk between adjacent stacks of the memory cells MC arranged along the direction Y may be reduced. In addition, in some embodiments, the channel layers 110 at opposing sidewalls of adjacent stacking structures 102 are laterally spaced apart. In these embodiments, the channel layers 110 may or may not laterally extend along the portions of the base layer 100 between the stacking structures 102, but each of the channel layers 110 may not further extend to be in contact with another one of the channel layers 110. The channel layers 110 may be formed of polysilicon or a metal oxide semiconductor material. The metal oxide semiconductor material may include an indium-based oxide material, such as indium gallium zinc oxide (IGZO).

Pairs of conductive pillars 112 stand on the portions of the base layer 100 between the stacking structures 102. The conductive pillars 112 in each pair are separately located between and in lateral contact with two of the channel layers 110 covering opposing sidewalls of adjacent stacking structures 102. Further, adjacent pairs of the conductive pillars 112 arranged along the direction Y are laterally separated as well. In some embodiments, isolation structures 114 are respectively filled between the conductive pillars 112 of each pair, so as to isolate the conductive pillars 112 of each pair from one another. In addition, in some embodiments, isolation pillars 116 respectively stand between adjacent pairs of the conductive pillars 112. In these embodiments, the isolation pillars 116 may further extend to be in lateral contact with the switching layers 108, so as to separate the channel layers 110 from one another. Moreover, in some embodiments, pairs of the conductive pillars 112 at a side of a stacking structure 102 are offset along the direction Y from pairs of the conductive pillars 112 at the other side of the stacking structure 102. In these embodiments, the memory cells MC may be referred as being arranged in a staggered configuration. The conductive pillars 112 are formed of a conductive material, while the isolation structures 114 and the isolation pillars 116 are respectively formed of an insulating material. For instance, the conductive material may include Al, Ti, TiN, TaN, Co, Ag, Au, Cu, Ni, Cr, Hf, Ru, W, Pt or the like, whereas the insulating material may include silicon oxide, silicon nitride, silicon oxynitride, silicon carbide, silicon carbo-nitride, silicon carbo-oxide or the like.

A segment of one of the word lines 104, a portion of one of the switching layers 108 that is in lateral contact with this segment of the word line 104, a portion of one of the channel layers 110 capacitively coupled to the segment of the word line 104 through the portion of the switching layer 108, and a pair of the conductive pillars 112 in contact with this channel layer 110 collectively form a field effect transistor. The segment of the word line 104 is functioned as a gate terminal of the field effect transistor, and the pair of the conductive pillars 112 are functioned as source and drain terminals of the field effect transistor. When the field effect transistor is turned on, a conductive path may be formed in the portion of the channel layer 110, and extend between the pair of the conductive pillars 112. On the other hand, when the field effect transistor is in an off state, the conductive path may be cut off or absent. The portion of the switching layer 108 is functioned for realizing capacitive coupling between the segment of the word line 104 and the portion of the channel layer 110, and for switching a threshold voltage of the field effect transistor from a lower value to a higher value (or vice versa). During a programming operation, a dipole moment is stored in the switching layer 108 due to ferroelectric polarization, or charges may be inserted into the switching layer 108 due to tunneling effect. On the other hand, during an erasing operation, a dipole moment reversal or removal of the trapped charges can be observed in the switching layer 108. By storing the dipole moments with opposite directions or inserting/removing charges, the field effect transistor may have a relatively high threshold voltage and a relatively low threshold voltage, thus a high logic state and a low logic state can be stored in the field effect transistor. Accordingly, the field effect transistor is capable of storing data, and is referred as the memory cell MC in the present disclosure.

As shown in FIG. 1A, the memory cells MC in the same stack may share the same switching layer 108, the same channel layer 110, and the same pair of the conductive pillars 112, while being controlled by different word lines 104 in the same stacking structure 102. Adjacent stacks of the memory cells MC at opposite sides of a pair of the conductive pillars 112 may share this pair of the conductive pillars 112, while having different channel layers 110 and being controlled by word lines 104 in adjacent ones of the stacking structures 102. Adjacent stacks of the memory cells MC at opposite sides of the same stacking structure 102 may share the word lines 104 in this stacking structure 102, while having different switching layers 108, different channel layers 110 and different pairs of the conductive pillars 112. In addition, adjacent stacks of the memory cells MC in the same column may share the same switching layer 108 and the word lines 104 in the same stacking structure 102, while having different channel layers 110 and different pairs of the conductive pillars 112.

Figure 1B:
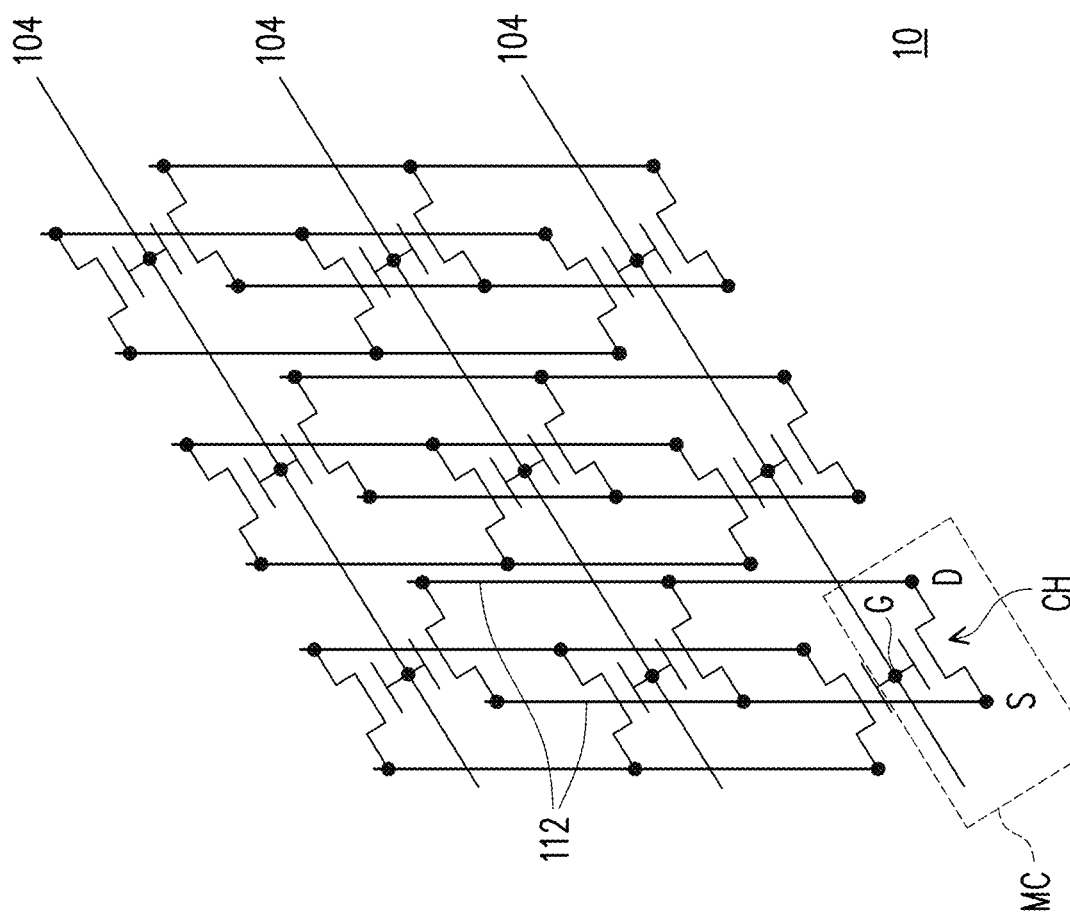
FIG. 1B is an equivalent circuit diagram of a portion of the three-dimensional memory device 10 described with reference to FIG. 1A.

FIG. 1B is an equivalent circuit diagram of a portion of the three-dimensional memory device 10 described with reference to FIG. 1A.

Referring to FIG. 1A and FIG. 1B, the word lines 104 are stacked along the vertical direction Z. Each word line 104 connects gate terminals G of two laterally adjacent columns of the memory cells MC. In addition, each pair of the conductive pillars 112 connect to source and drain terminals S, D of a stack of the memory cells MC. The gate terminals G of each stack of the memory cells MC are respectively connected to one of the word lines 104. In addition, the source terminals S of each stack of the memory cells MC are connected together by one of the conductive pillars 112, and the drain terminals D of each stack of the memory cells MC are connected together by another one of the conductive pillars 112. Consequently, channels CH between the source and drain terminals S, D of each stack of the memory cells MC are connected in parallel.

Referring back to FIG. 1A, end portions of the stacking structures 102 are shaped into staircase structures SC, and the word lines 104 extend to steps of the staircase structures SC. Since the word lines 104 can each extend to one of the steps, the word lines 104 can be independently out-routed. It should be noted that, FIG. 1A merely shows the staircase structures SC at a single side of the three-dimensional memory device 10. As to be further described with reference to FIG. 2, opposite sides of each stacking structure 102 can be respectively shaped into a staircase structure SC.

Figure 2:
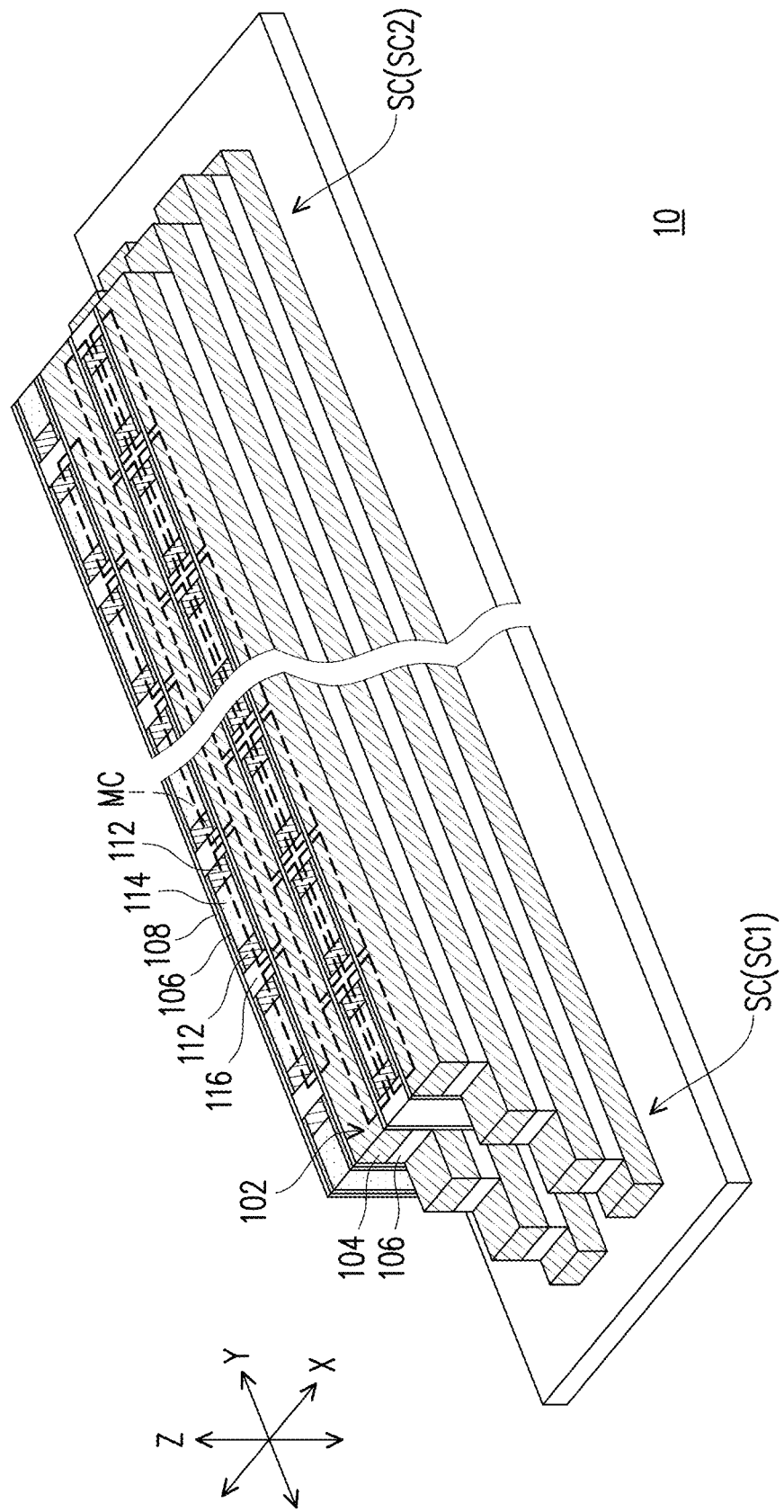
FIG. 2 is a three-dimensional view schematically illustrating the three-dimensional memory device with staircase structures at opposite sides, according to some embodiments of the present disclosure.

FIG. 2 is a three-dimensional view schematically illustrating the three-dimensional memory device 10 with staircase structures SC1, SC2 at opposite sides, according to some embodiments of the present disclosure.

Referring to FIG. 2, both ends of each stacking structure 102 are respectively shaped into a staircase structure SC. The staircase structures SC at one side of the three-dimensional memory device 10 are referred as staircase structures SC1, while the staircase structures SC at the other side of the three-dimensional memory device 10 are referred as staircase structures SC2. Further, a portion of the three-dimensional memory device 10 where stacks of the memory cells MC are formed may be referred as an array region. Opposite end portions of each word line 104 in a stacking structure 102 (except for the topmost word line 104) laterally protrude with respect to end portions of an overlying word line 104 in the same stacking structure 102 along the column direction (i.e., the direction Y), to form steps on the same level and at opposite ends of the stacking structure 102. In addition, end portions of the topmost word line 104 in a stacking structure 102 may define the topmost steps of the staircase structures SC1, SC2 at opposite ends of the stacking structure 102. In this way, each of the word lines 104 may have end portions not covered by others of the word lines 104, thus can be independently out-routed. In some embodiments, end portions of each isolation layer 106 in a stacking structure 102 are aligned with end portions of an overlying word line 104, and each defines a bottom portion of a step. In these embodiments, each step of a staircase structure SC consists of end portions of one of the word lines 104 and an underlying isolation layer 106. Further, although not shown, components between adjacent stacking structures 102 (except for the conductive pillars 112 and the channel layers 110) may further spread between adjacent staircase structures SC1 and between adjacent staircase structures SC2. Moreover, as similar to the insulating structure 118 to be described with reference to FIG. 3C, the staircase structures SC1, SC2 may be covered by an insulating structure having a top surface substantially coplanar with or higher than top surfaces of the stacking structures 102.

Figure 3A:
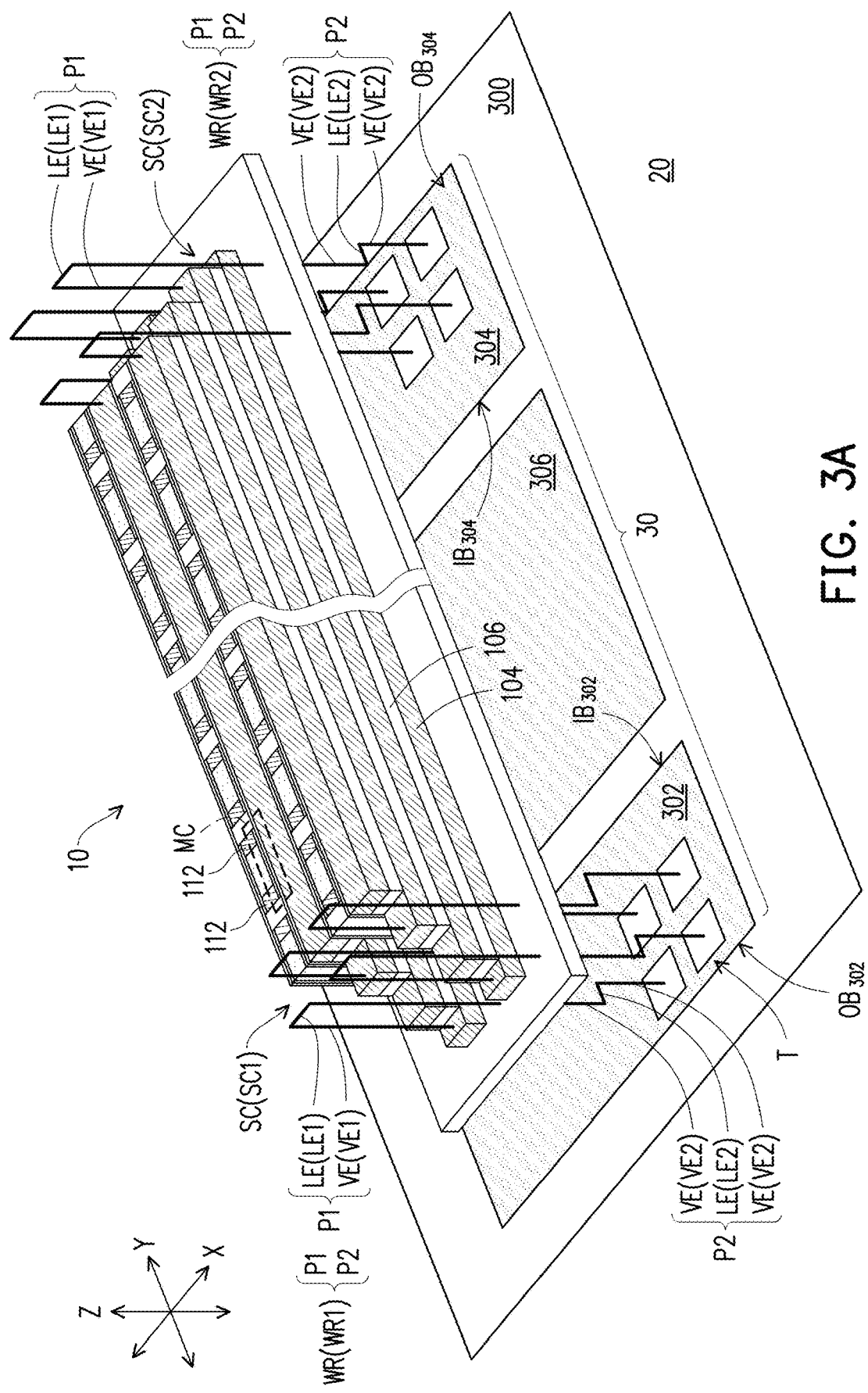
FIG. 3A is a schematic diagram illustrating an integrated circuit including the three-dimensional memory device, according to some embodiments of the present disclosure.

FIG. 3A is a schematic diagram illustrating an integrated circuit 20 including the three-dimensional memory device 10 as described above, according to some embodiments of the present disclosure.

Referring to FIG. 3A, the integrated circuit 20 includes the three-dimensional memory device 10, and further includes a driving circuit 30 configured to drive the three-dimensional memory device 10. In some embodiments, the driving circuit 30 lies under the three-dimensional memory device 10. The driving circuit 30 may include active devices formed on a surface of a semiconductor substrate 300, and may include interconnections running above the active devices and configured to interconnect the active devices. The semiconductor substrate 300 is such as a semiconductor wafer (e.g., a silicon wafer) or a semiconductor-on-insulator (SOI) wafer (e.g., a silicon-on-insulator wafer). The active devices may, for example, include metal-oxide-semiconductor (MOS) transistors. Further, the active devices may be a portion of a front-end-of-line (FEOL) structure (e.g., the FEOL structure FE to be described with reference to FIG. 3C) in the integrated circuit 20, and the interconnections may be integrated in a back-end-of-line (BEOL) structure (e.g., the BEOL structure BE to be described with reference to FIG. 3C) formed on the FEOL structure. In some embodiments, the three-dimensional memory device 10 is also integrated in the BEOL structure, and lies over the interconnections of the driving circuit 30. In some embodiments, the driving circuit 30 includes word line driving circuits 302, 304. The word lines 104 in the three-dimensional memory device 10 are routed to the word line driving circuits 302, 304 from the steps of the staircase structures SC1, SC2, and can be controlled by the word line driving circuits 302, 304. Each of the word line driving circuits 302, 304 may include a plurality of transistors T respectively connected to one of the word lines 104. In some embodiments, the word lines 104 are respectively routed to a source/drain (S/D) terminal of one of the transistors T. Although only a few transistors T are depicted, each of the word line driving circuits 302, 304 may include more of the transistors T, and these transistors T may be arranged along rows and columns in each of the word line driving circuits 302, 304.

Figure 3B:
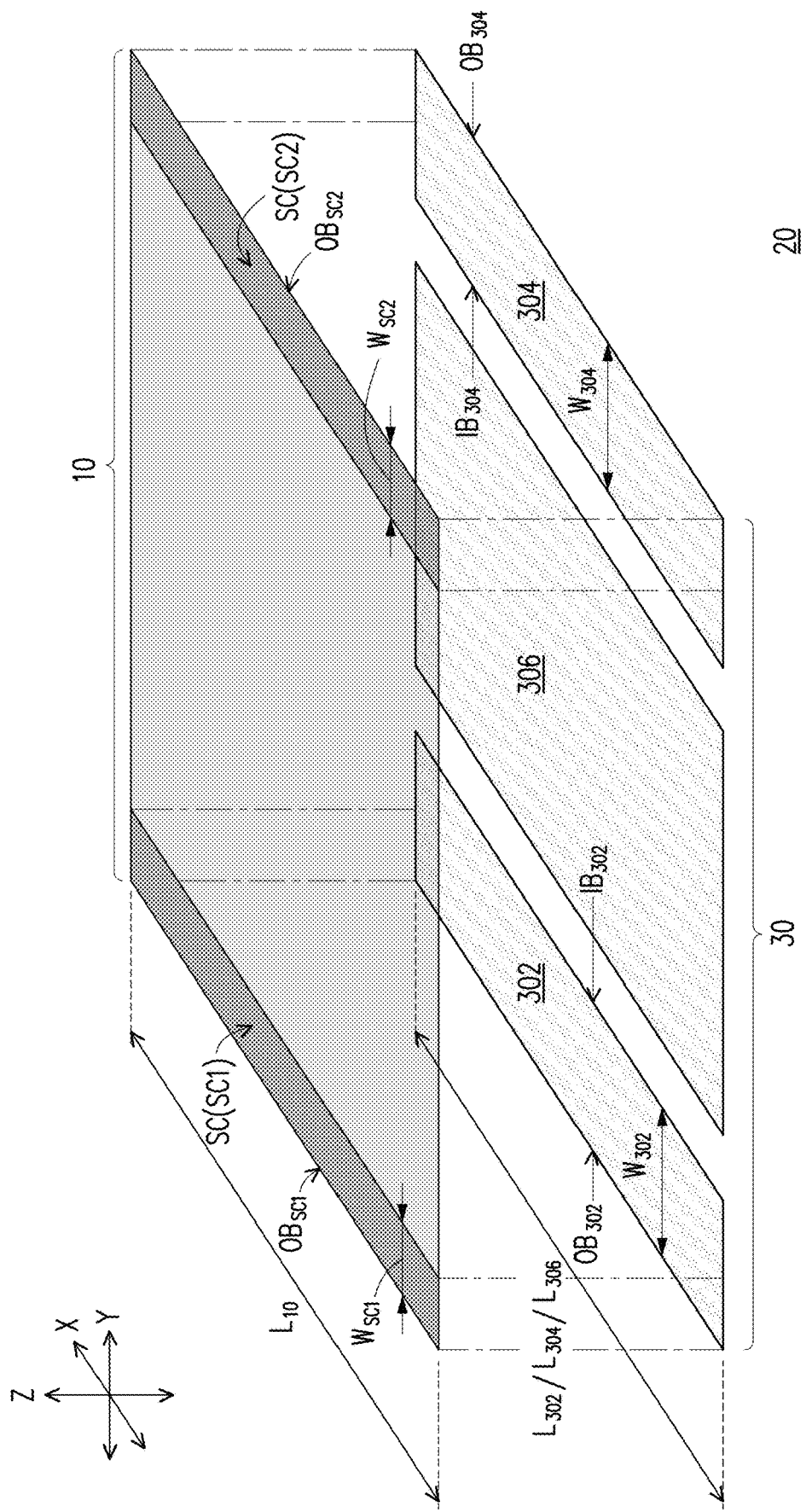
FIG. 3B is a schematic diagram illustrating a configuration of the driving circuit and the three-dimensional memory device in the integrated circuit, according to some embodiments of the present disclosure.

FIG. 3B is a schematic diagram illustrating a configuration of the driving circuit 30 and the three-dimensional memory device 10, according to some embodiments of the present disclosure.

Referring to FIG. 3A and FIG. 3B, in some embodiments, the staircase structures SC1, SC2 at opposite sides of the three-dimensional memory device 10 are respectively overlapped with one of the word line driving circuits 302, 304. For instance, the staircase structures SC1 may be overlapped with the word ling driving circuit 302, while the staircase structures SC2 may be overlapped with the word line driving circuit 304. The word line driving circuit 302 may extend along a side of the three-dimensional memory device 10 where the stacking structures 102 are shaped into the staircase structure SC1. A length $L_{302}$ of the word line driving circuit 302 measured along the direction X may be substantially equal to a length $L_{10}$ of the three-dimensional memory device 10 measured along the same direction. In some embodiments, an outer boundary $OB_{302}$ of the word line driving circuit 302 is substantially aligned with an outer boundary $OB_{SC1}$ of the overlying staircase structures SC1, which may be defined by sidewalls of the bottommost steps of the staircase structures SC1. Further, the word line driving circuit 302 spans from the outer boundary $OB_{302}$ to an inner boundary $IB_{302}$ along the column direction (i.e., the direction Y). In some embodiments, a footprint area of the word line driving circuit 302 is greater than a footprint area of the staircase structures SC1, and a width $W_{302}$ measured from the outer boundary $OB_{302}$ to the inner boundary $IB_{302}$ is greater than a width $W_{SC1}$ by which the staircase structures SC1 span from the outer boundary $OB_{SC1}$. In these embodiments, substantially the entire staircase structures SC1 may be overlapped with the word line driving circuit 302. In addition, an outer portion of the word line driving circuit 302 may be overlapped with the staircase structures SC1, while an inner portion of the word line driving circuit 302 may be overlapped with the array region of the three-dimensional memory device 10 that is located between the staircase structures SC1, SC2.

On the other hand, the word line driving circuit 304 may extend along another side of the three-dimensional memory device 10 where the stacking structures 102 are shaped into the staircase structures SC2. A length $L_{304}$ of the word line driving circuit 304 measured along the direction X may be substantially equal to a length $L_{10}$ of the three-dimensional memory device 10 measured along the same direction. In some embodiments, an outer boundary $OB_{304}$ of the word line driving circuit 304 is substantially aligned with an outer boundary $OB_{SC2}$ of the overlying staircase structures SC2, which may be defined by sidewalls of the bottommost steps of the staircase structures SC2. Further, the word line driving circuit 304 spans from the outer boundary $OB_{304}$ to an inner boundary $IB_{304}$ along the column direction (i.e., the direction Y). In some embodiments, a footprint area of the word line driving circuit 304 is greater than a footprint area of the staircase structures SC2, and a width $W_{304}$ measured from the outer boundary $OB_{304}$ to the inner boundary $IB_{304}$ is greater than a width $W_{SC2}$ by which the staircase structures SC2 span from the outer boundary $OB_{SC2}$. In these embodiments, substantially the entire staircase structures SC2 may be overlapped with the word line driving circuit 304. In addition, an outer portion of the word line driving circuit 304 may be overlapped with the staircase structures SC2, while an inner portion of the word line driving circuit 304 may be overlapped with the array region of the three-dimensional memory device 10 that is located between the staircase structures SC1, SC2.

Figure 3C:
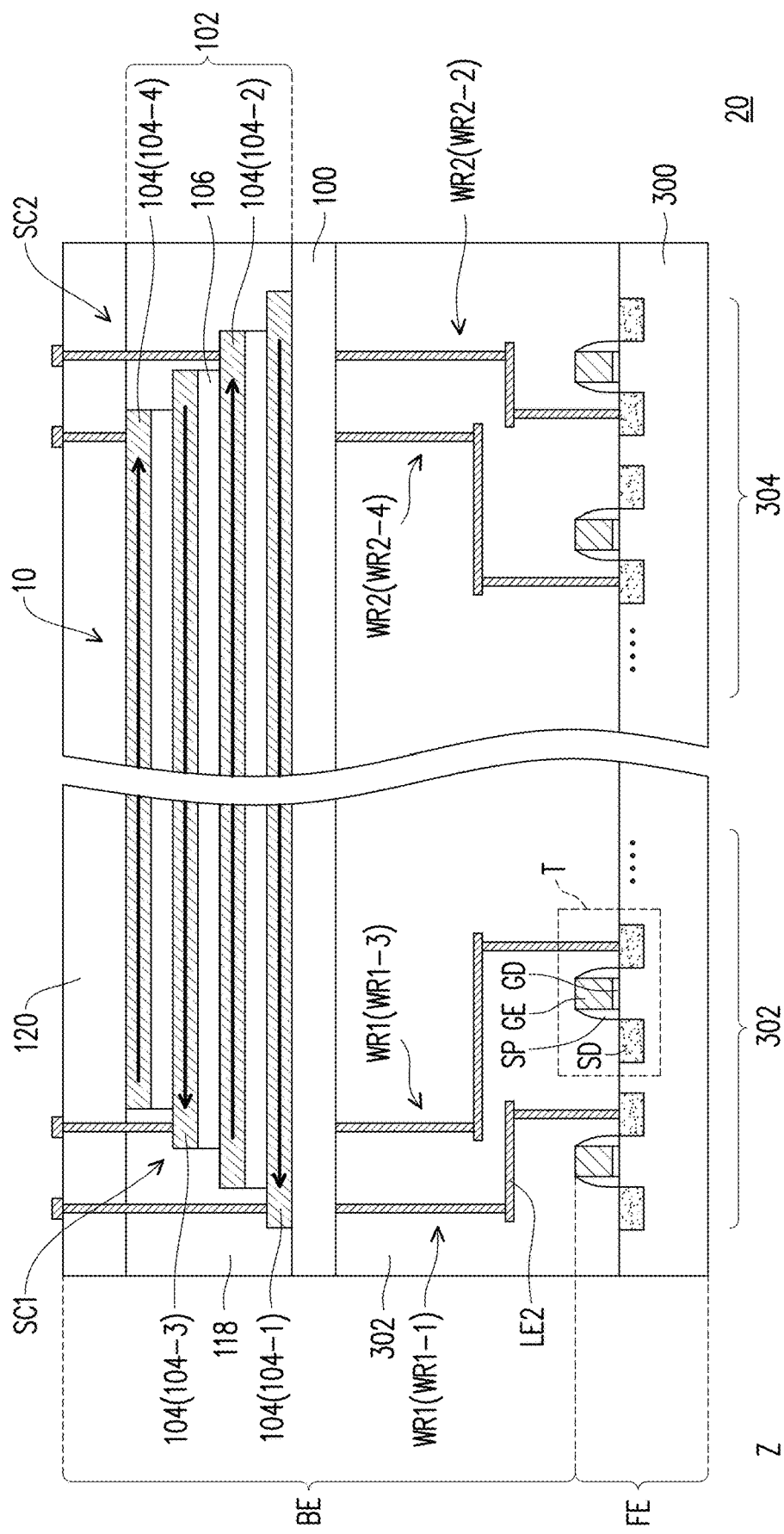
FIG. 3C is a cross-sectional view schematically illustrating a routing scheme for word lines in the same stacking structure, according to some embodiments of the present disclosure.

As shown in FIG. 3A, the word lines 104 are routed to the word line driving circuits 302, 304 through word line routings WR. Each of the word line routings WR may have a combination of vertical extending portions VE and laterally extending portions LE, for routing one of the word lines 104 to a corresponding transistor T in the word line driving circuits 302, 304. The laterally extending portion LE of a word line routing WR lies on one of interlayer dielectric layers in the BEOL structure (e.g., the BEOL structure BE to be described with reference to FIG. 3C), and may also be referred as a conductive trace. On the other hand, the vertically extending portion VE of a word line routing WR penetrates through one or more of the interlayer dielectric layer(s) in the BEOL structure to establish electrical connection with one or more of the laterally extending portion(s) in the same word line routing WR, and may include one or more conductive via(s). As to be described with reference to FIG. 3C, the staircase structures SC may be covered by an insulating structure (e.g., the insulating structure 118 as shown in FIG. 3C). In order to out-rout a word line 104 from a step of a staircase structure SC, a first part P1 of the corresponding word line routing WR may extend through such insulating structure from the step by a vertically extending portion VE (referred as a vertically extending portion VE1), to a laterally extending portion LE (referred as a laterally extending portion LE1) lying over the three-dimensional memory device 10. The laterally extending portion LE1 of the first part P1 may run along the row direction (i.e., the direction X), to a bound aside this staircase structure SC. A second part P2 of the word line routing WR may extend from the bound of the laterally extending portion LE1 of the first part P1, to the corresponding transistor T below the three-dimensional memory device 10. A landing terminal of the transistor T (e.g., a source/drain terminal) may be laterally offset from the bound of the laterally extending portion LE1 of the first part P1 along the column direction (i.e., the direction Y), such that the second part P2 of the word line routing WR may include a laterally extending portion LE (referred as a laterally extending portion LE2) running along the column direction (i.e., the direction Y), and may include vertically extending portions VE (referred as vertically extending portions VE2) connected to opposite ends of the laterally extending portion LE2. One of the vertically extending portions VE2 connects the laterally extending portion LE2 to the first part P1 of the word line routing WR, and the other vertically extending portion VE2 connects the laterally extending portion LE2 to the transistor T.

Figure 3D:
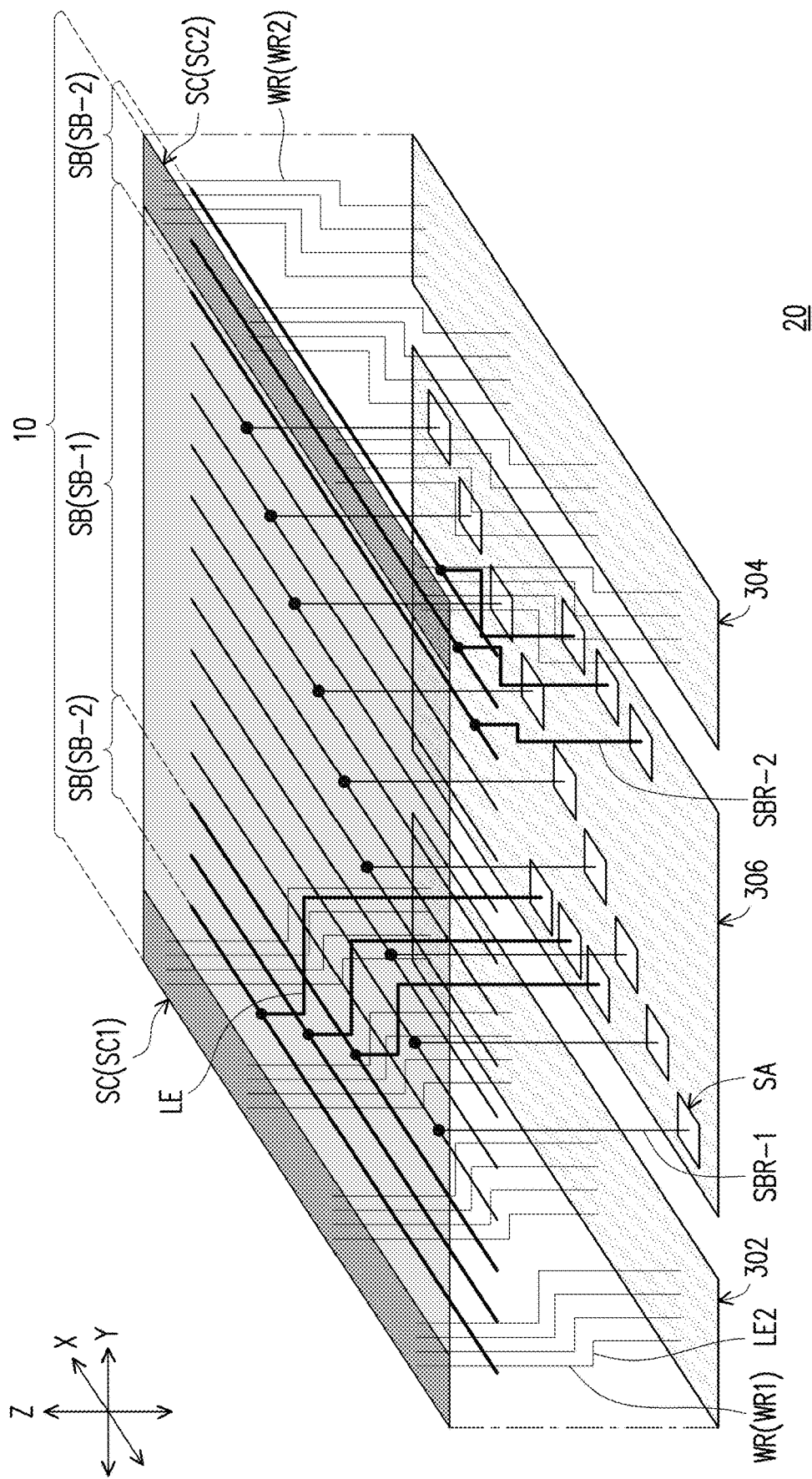
FIG. 3D is a schematic diagram illustrating a word line routing scheme and a source line/bit line routing scheme, according to some embodiments of the present disclosure.

Referring to FIG. 3A and FIG. 3B, the word line routings WR extending from the steps of the staircase structures SC1 to the transistors T in the word line driving circuit 302 may be referred as word line routings WR1. The transistors T in the word line driving circuit 302 are arranged from the outer boundary $OB_{302}$, which may be substantially aligned with the outer boundary $OB_{SC1}$ of the staircase structures SC1, to the inner boundary $IB_{302}$ by the width $W_{302}$ greater than the width $W_{SC1}$ of the staircase structures SC1. In addition, the transistors T in the word line driving circuit 302 are arranged as multiple columns extending along the direction Y. The word line routings WR1 extending from a staircase structure SC1 may connect to a column of the transistors T. A word line routing WR1 extending from a higher step of a staircase structure SC may be connected to a transistor T more distant from the outer boundary $OB_{302}$ than a transistor T routed from a lower step in the same staircase structure SC1. Further, a pitch of the transistors T in a column may be much greater than a step width of the staircase structure SC1 measured along the column direction (i.e., the direction Y). Hence, a higher step in a staircase structure SC1 may be offset from a corresponding transistor T along the direction Y by a distance greater than an offset of a lower step with respect to a corresponding transistor T. Accordingly, at least some of the word line routings WR1 may have laterally extending portions LE2 running away from the outer boundary $OB_{302}$ along the column direction (i.e., the direction Y), for compensating the lateral offset. Further, a word line routing WR1 connected to a higher step may have a laterally extending portion LE2 running by a distance greater than a distance by which a laterally extending portion LE2 of a word line routing WR1 connected to a lower step runs (as shown in FIG. 3C and FIG. 3D).

On the other hand, the word line routings WR extending from the steps of the staircase structures SC2 to the transistors T in the word line driving circuit 304 may be referred as word line routings WR2. The transistors T in the word line driving circuit 302 are arranged from the outer boundary $OB_{304}$, which may be substantially aligned with the outer boundary $OB_{SC2}$ of the staircase structures SC2, to the inner boundary $IB_{304}$ by the width $W_{304}$ greater than the width $W_{SC2}$ of the staircase structures SC2. In addition, the transistors T in the word line driving circuit 304 are arranged as multiple columns extending along the direction Y. The word line routings WR2 extending from a staircase structure SC2 may connect to a column of the transistors T. A word line routing WR2 extending from a higher step of a staircase structure SC may be connected to a transistor T more distant from the outer boundary $OB_{304}$ than a transistor T routed from a lower step in the same staircase structure SC2. Further, a pitch of the transistors T in a column may be much greater than a step width of the staircase structure SC2 measured along the column direction (i.e., the direction Y). Hence, a higher step in a staircase structure SC2 may be offset from a corresponding transistor T along the direction Y by a distance greater than an offset of a lower step with respect to a corresponding transistor T. Accordingly, at least some of the word line routings WR2 may have laterally extending portions LE2 running away from the outer boundary $OB_{304}$ along the column direction (i.e., the direction Y). Further, a word line routing WR2 connected to a higher step may have a laterally extending portion LE2 running by a distance greater than a distance by which a laterally extending portion LE2 of a word line routing WR2 connected to a lower step runs (as shown in FIG. 3C and FIG. 3D).

The word line routings WR should be spaced apart from one another. In order to separate the word line routings WR extending from steps of the same staircase structure SC1/SC2, the laterally extending portions LE2 of these word line routings WR may be disposed on different interlayer dielectric layers in the BEOL structure (e.g., the BEOL structure BE to be described with reference to FIG. 3C). In other words, the laterally extending portions LE2 of the word line routings WR extended from steps of the same staircase structure SC1/SC2 may be formed in metallization layers at different horizontal levels. For instance, one of these laterally extending portions LE2 may be a portion of a $n^{th}$ metallization layer, and an adjacent one of these laterally extending portions LE2 may be a portion of a $(n+1)^{th}$ metallization layer. As an amount of the word lines 104 in each stacking structure 102 increases, more of the metallization layers are required in the BEOL structure. In some embodiments, some of the word lines 104 in a stacking structure 102 are routed to the word line driving circuit 302 from a staircase structure SC1 through some word line routings WR1, while others of the word lines 104 in the stacking structure 102 are routed to the word line driving circuit 302 from a staircase structure SC2 through some word line routings WR2. Since the word line routings WR1 and the word line routings WR2 are at opposite sides of the three-dimensional memory device 10, the laterally extending portions LE2 of the word line routings WR1 can be sufficiently spaced apart from the laterally extending portions LE2 of the word line routings WR2. Therefore, a metallization layer in the BEOL structure may be shared by the laterally extending portions LE2 of some of the word line routings WR1 and the laterally extending portions LE2 of some of the word line routings WR2. Consequently, the amount of the metallization layers in the BEOL structure can be reduced. Alternatively, each stacking structure 102 may include more of the word lines 104.

FIG. 3C is a cross-sectional view schematically illustrating the routing scheme for the word lines 104 in the same stacking structure 102, according to some embodiments of the present disclosure.

In some embodiments, as indicated by the arrows along the word lines 104 shown in FIG. 3C, the word lines 104 in the same stacking structure 102 are alternately routed to the word line driving circuit 302 and the word line driving circuit 304. The word lines 104 routed to the word line driving circuit 302 are connected to the word line routings WR1, while the word lines 104 routed to the word line driving circuit 304 are connected to the word line routings WR2. As an example shown in FIG. 3C, the word lines 104 in a stacking structure 102 may include word lines 104-1, 104-2, 104-3, 104-4 sequentially stacked on the base layer 100, and separated from one another by the isolation layers 106. The word lines 104-1, 104-3 are routed to the word line driving circuit 302 through the word line routings WR1 including word line routings WR1-1, WR1-3. The word lines 104-2, 104-4 are routed to the word line driving circuit 304 through the word line routings WR2 including word line routings WR2-2, WR2-4. It should be noted that, the word line routings WR1-1, WR1-3, WR2-2, WR2-4 are each partially depicted in FIG. 3C, and may actually resemble the word line routings WR1, WR2 depicted in FIG. 3A. The word line routing WR1-1 may have a laterally extending portion LE2 as a portion of a $n^{th}$ metallization layer, and the word line routing WR1-3 may have a laterally extending portion LE2 as a portion of a $(n+1)^{th}$ metallization layer over the $n^{th}$ metallization layer. Since the word line routings WR2-2, WR2-4 are located at another side of the three-dimensional memory device 10, the laterally extending portions LE2 of the word line routings WR2-2, WR2-4 do not have to be formed in other metallization layers for keeping spaced apart from the laterally extending portions LE2 of the word line routings WR1-1, WR1-3. In some embodiments, the laterally extending portion LE2 of the word line routing WR2-2 may be another portion of the $n^{th}$ metallization layer, and the laterally extending portion LE2 of the word line routing WR2-4 may be another portion of the $(n+1)^{th}$ metallization layer. In other words, the $n^{th}$ metallization layer may be shared by the laterally extending portions LE2 of the word line routings WR1-1, WR2-2, and the $(n+1)^{th}$ metallization layer may be shared by the laterally extending portions LE2 of the word line routings WR1-3, WR2-4. As a result, the amount of the metallization layers in the BEOL structure may be significantly reduced.

As also shown in FIG. 3C, the staircase structures SC1, SC2 are covered by an insulating structure 118, and an interlayer dielectric layer 120 lies on the insulating structure 118 and the three-dimensional memory device 10. In addition, a stack of interlayer dielectric layers 302 lie below the base layer 100 of the three-dimensional memory device 10. The transistors T are formed on a surface region of the semiconductor substrate 300, and are covered by the interlayer dielectric layers 302. Each transistor T may include a gate electrode GE over the semiconductor substrate 300 and capacitively coupled to the semiconductor substrate 300 through a gate dielectric layer GD, and may include source/drain structures SD at opposite sides of a gate stacking structure including the gate electrode GE and the gate dielectric layer GD. In some embodiments, the gate stacking structure is laterally surrounded by a gate spacer SP. It should be noted that, although the transistors T are depicted as a planar-type field effect transistors, the transistors T may be alternatively formed as fin-type field effect transistors (fin-FETs) or gate-all-around (GAA) field effect transistors, according to other embodiments of the present disclosure. The semiconductor substrate 300 and components formed on a surface of the semiconductor substrate 300 (including the transistors T) are referred as a FEOL structure FE. In addition, components formed on the FEOL structure FE are referred as a BEOL structure BE. The word line routings WR and the three-dimensional memory device 10 are integrated in the BEOL structure BE, and bottom portions of the word line routings WR may be considered as extending to the FEOL structure FE.

Referring to FIG. 3A and FIG. 3B again, the driving circuit 30 may further include a source line/bit line driving circuit 306. The source line/bit line driving circuit 306 may be formed between the word line driving circuits 302, 304. A length $L_{306}$ of the source line/bit line driving circuit 306 measured along the direction X may be substantially equal the length $L_{10}$ of the three-dimensional memory device 10 measured along the same direction. In some embodiments, the source line/bit line driving circuit 306 is laterally spaced apart from the word line driving circuits 302, 304. In these embodiments, buffer circuit(s), row/column decoders, power generation circuit(s), the like or combinations thereof may be formed in the spacings between the source line/bit line driving circuit 306 and the word line driving circuits 302, 304. In alternative embodiments, the source line/bit line driving circuit 306 may be adjacent to the word line driving circuits 302, 304 without additional circuits (e.g., the buffer circuit(s), row/column decoders, power generation circuit(s) or the like) in between. Although not shown in FIG. 3A, the conductive pillars 112 of each memory cell MC in the three-dimensional memory device 10 are connected to a source line and a bit line, respectively. The source lines and the bit lines lie above and/or below the three-dimensional memory device 10, and the source lines as well as the bit lines are routed to the source line/bit line driving circuit 306.

FIG. 3D is a schematic diagram illustrating a word line routing scheme and a source line/bit line routing scheme, according to some embodiments of the present disclosure.

Referring to FIG. 3A and FIG. 3D, the word line routings WR partially shown in FIG. 3D extend between the staircase structures SC and the word line driving circuits 302, 304. In some embodiments, source lines/bit lines SB are arranged below the three-dimensional memory device 10, and are connected to the conductive pillars 112 through conductive vias (not shown) penetrating through the base layer 100. The source lines/bit lines SB may extend along the row direction (i.e., the direction X), and may be arranged along the column direction (i.e., the direction Y). Some of the source lines/bit lines SB are overlapped with the source line/bit line driving circuit 306, and may be referred as source lines/bit lines SB-1. The source lines/bit lines SB-1 are routed to the underlying source line/bit line driving circuit 306 through source line/bit line routings SBR-1. The source line/bit line routings SBR-1 may extend along the vertical direction Z, and respectively include a vertical extending portion. The vertical extending portion may include one or more conductive via(s), each penetrating through at least one interlayer dielectric layer (e.g., the interlayer dielectric layer 302 as described with reference to FIG. 3C). In some embodiments, the source line/bit line routings SBR-1 are respectively connected to an active device SA of the source line/bit line driving circuit 306. The active device SA may be a sense amplifier, a bit line selector or the like. On the other hand, others of the source lines/bit lines SB are not overlapped with the source line/bit line driving circuit 306, and may be referred as source lines/bit lines SB-2. As similar to the source lines/bit lines SB-1, the source lines/bit lines SB-2 are routed to the active devices SA of the source line/bit line driving circuit 306. Since the source lines/bit lines SB-2 are offset from the source line/bit line driving circuit 306, source line/bit line routings SBR-2 extending from the source lines/bit lines SB-2 to the active devices AS may respectively include a laterally extending portion LE for compensating such lateral offset. As similar to the laterally extending portions LE2 of the word line routings WR, the laterally extending portions LE of the source line/bit line routings SBR-2 may respectively extend between two vertically extending portions in the same source line/bit line routing SBR-2. In some embodiments, the laterally extending portions LE of the source line/bit line routings SBR-2 extend along the column direction (i.e., the direction Y). Further, in some embodiments, the laterally extending portions LE of the source line/bit line routings SBR-2 may lie above or below the laterally extending portions LE2 of the word line routings WR. However, in alternative embodiments, the laterally extending portions LE of the source line/bit line routings SBR-2 and the laterally extending portions LE2 of the word line routings WR are portions of the same metallization layer, as long as these laterally extending portions are spaced apart from one another.

In other embodiments, the source lines and/or the bit lines extend above the three-dimensional memory device 10. In these embodiments, the source lines and/or the bit lines lying above the three-dimensional memory device 10 may be directed to the source line/bit line driving circuit 306 though a vertical path aside the three-dimensional memory device 10, as well as lateral and vertical paths running below the three-dimensional memory device 10 and bounded to the active devices SA in the source line/bit line driving circuit 306. Further, instead of being routed to the active devices SA, some of the source lines/bit liens SB (e.g. source lines) may be routed to ground terminals in the source line/bit line driving circuit 306.

Figure 4A:
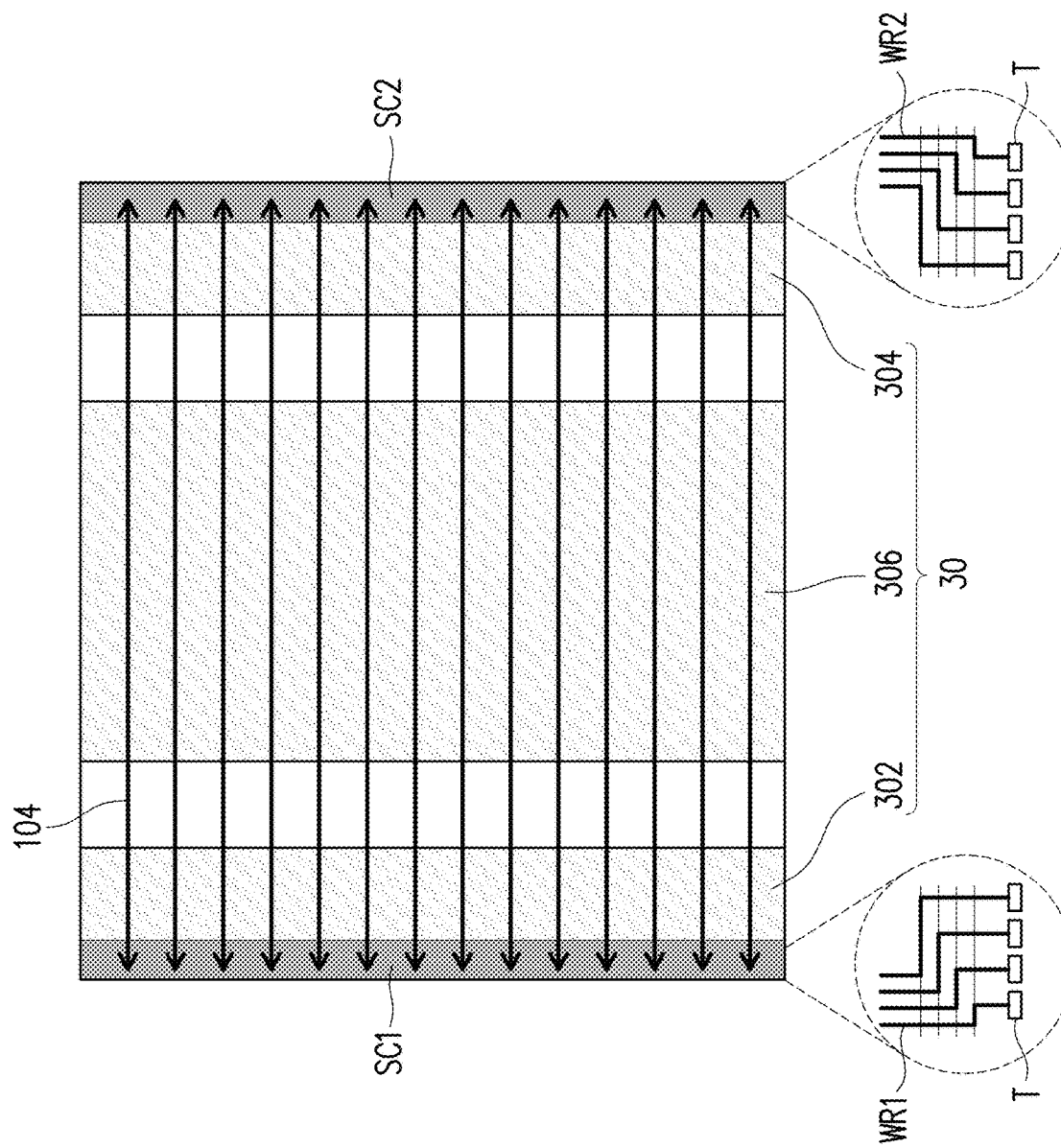
FIG. 4A is another diagram schematically illustrating the word line routing scheme as described with reference to FIG. 3A and FIG. 3C.

FIG. 4A is another diagram schematically illustrating the word line routing scheme as described with reference to FIG. 3A and FIG. 3C.

Referring to FIG. 3A and FIG. 4A, the three-dimensional memory device 10 is overlapped with the underlying driving circuit 30, and only the staircase structure SC1, SC2 and the word lines 104 of the three-dimensional memory device 10 are depicted to indicate the location of the three-dimensional memory device 10. The staircase structures SC1, SC2 are disposed at opposite sides of the three-dimensional memory device 10. The staircase structures SC1 are overlapped with an outer portion of the underlying word line driving circuit 302, and the staircase structures SC2 are overlapped with an outer portion of the underlying word line driving circuit 304. The word lines 104 extend between the opposite sides of the three-dimensional memory device 10, to the steps of the staircase structures SC1, SC2. Each stack of the word lines 104 are depicted by a bidirectional arrow, which indicates that some of the word lines 104 in each stack may be out-routed via one of the staircase structures SC1 at a side of the three-dimensional memory device 10, while others of the word lines 104 in each stack may be out-routed via one of the staircase structures SC2 at a second side of the three-dimensional memory device 10. The region enclosed by a dash line and led to the staircase structures SC1 depicts the word line routings WR1 extending from the staircase structures SC1 to the transistors T in the word line driving circuit 302. On the other hand, the region enclosed by a dash line and led to the staircase structures SC2 depicts the word line routings WR2 extending from the staircase structures SC2 to the transistors T in the word line driving circuit 304. As described with reference to FIG. 3A and FIG. 3C, by applying such bidirectional word line routing scheme, the amount of the metallization layers in the BEOL structure BE can be significantly reduced.

Figure 4B:
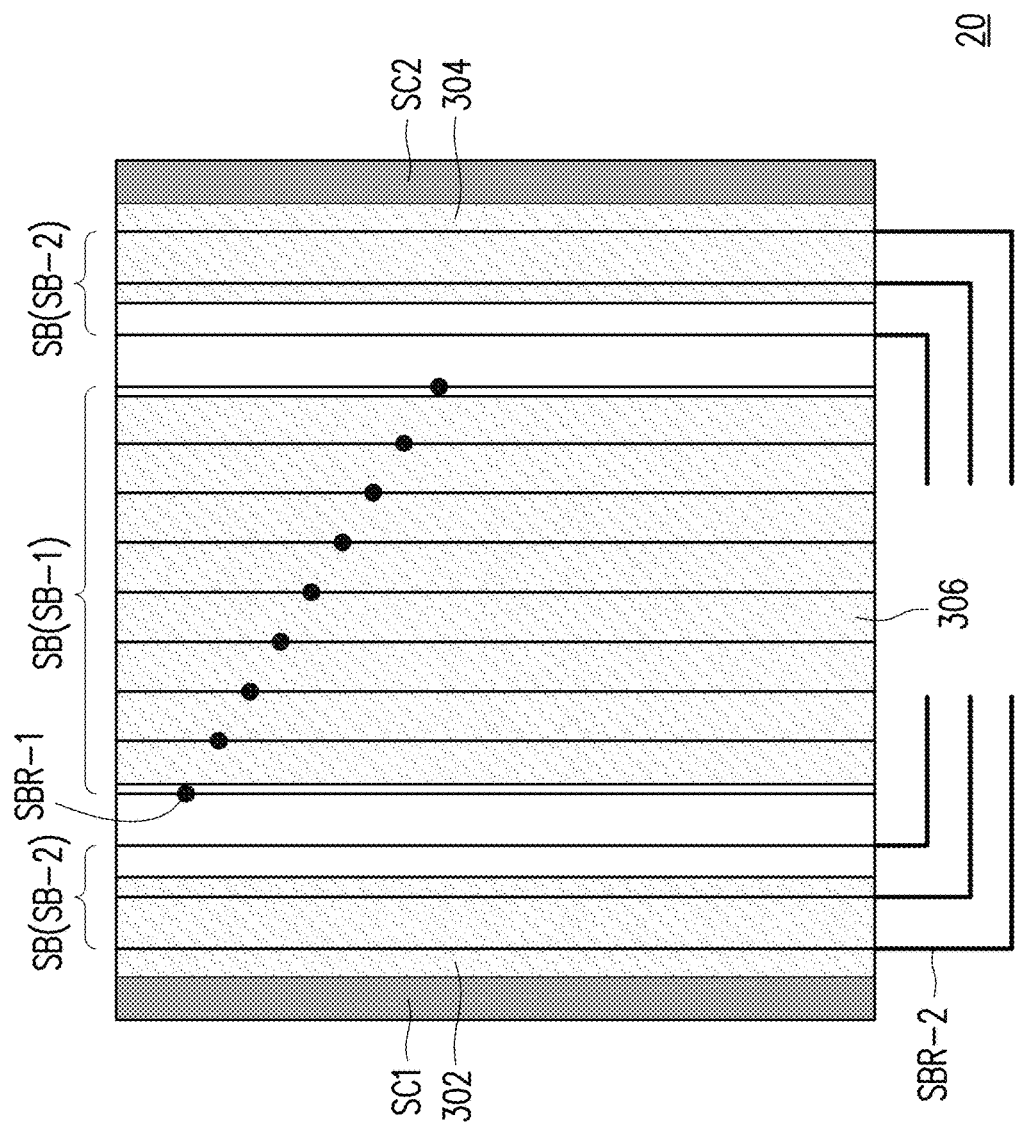
FIG. 4B is another diagram schematically illustrating the source line/bit line routing scheme as described with reference to FIG. 3D.

FIG. 4B is another diagram schematically illustrating the source line/bit line routing scheme as described with reference to FIG. 3D.

Referring to FIG. 3D and FIG. 4B, the three-dimensional memory device 10 is overlapped with the underlying driving circuit 30, and only the staircase structure SC1, SC2 and the source lines/bit lines SB of the three-dimensional memory device 10 are depicted to indicate the location of the three-dimensional memory device 10. It should be noted that, for conciseness, the word lines 104 as well as the word line routings WR are omitted in FIG. 4B. The source lines/bit lines SB-1 are overlapped with the source line/bit line driving circuit 306, and are routed to the source line/bit line driving circuit 306 via the source line/bit line routings SBR-1, which are indicated by solid dots in FIG. 4B. On the other hand, the source lines/bit lines SB-2 are not overlapped with the source line/bit line driving circuit 306, and are routed to the source line/bit line driving circuit 306 via the source line/bit line routings SBR-2, which are indicated by the "L" shape lines in FIG. 4B.

Figure 5:
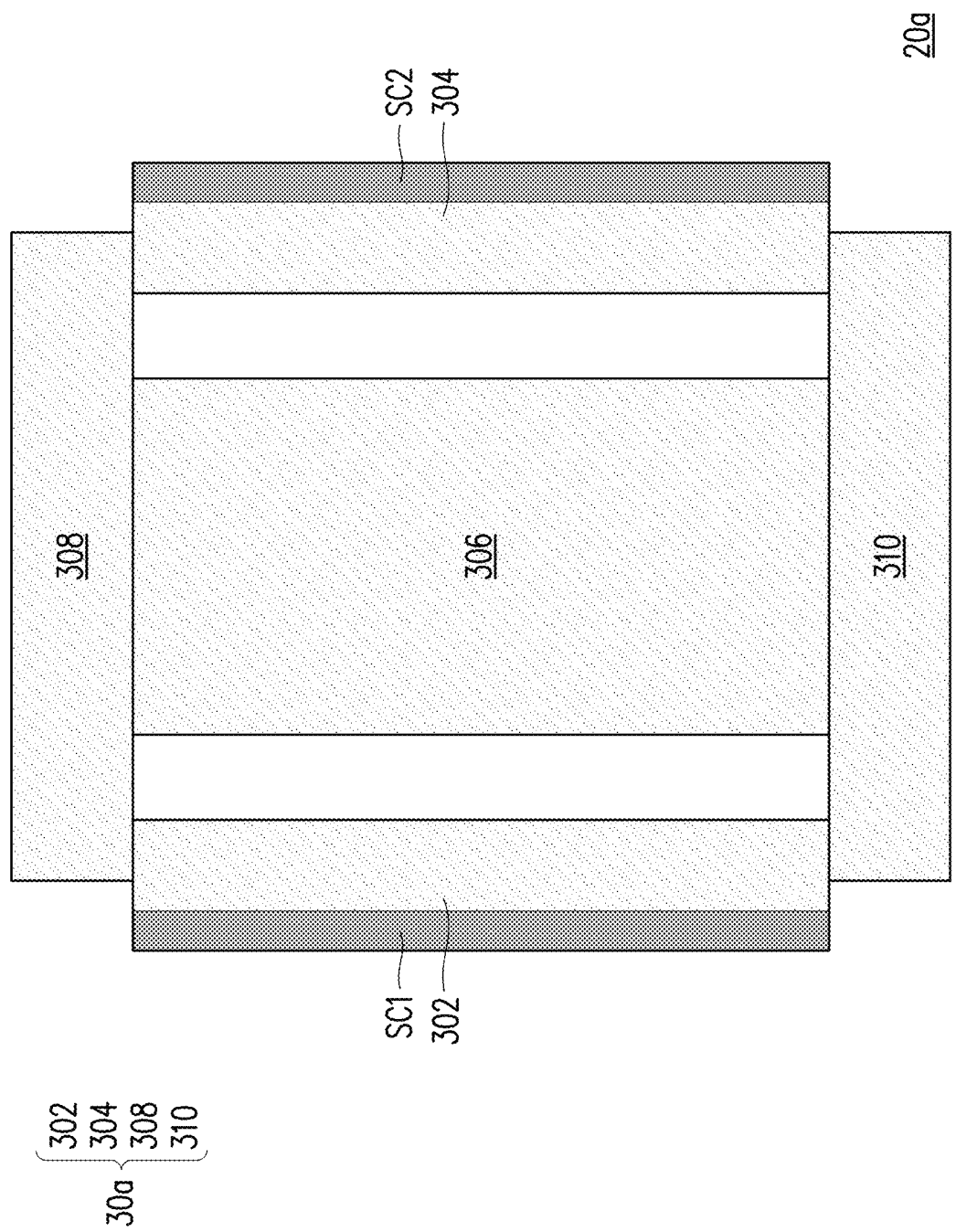
FIG. 5 is a schematic plan view illustrating an integrated circuit, according to alternative embodiments of the present disclosure.

FIG. 5 is a schematic plan view illustrating an integrated circuit 20a, according to alternative embodiments of the present disclosure. The integrated circuit 20a is similar to the integrated circuit 20 as described with reference to FIGS. 3A-3D, 4A, 4B, thus only differences between the integrated circuits 20, 20a will be described. The same or the like parts of the integrated circuits 20, 20a may not be repeated again.

Referring to FIG. 5, in addition to the word line driving circuits 302, 304, an integrated circuit 20a may further include additional word line driving circuits 308, 310. The word line driving circuits 302, 304 and the additional word line driving circuits 308, 310 may laterally surround the source line/bit line driving circuit 306. In some embodiments, the additional word line driving circuit 308, 310 are adjacent to the source line/bit line driving circuit 306 without additional circuits (e.g., the buffer circuit(s), row/column decoders, power generation circuit(s) or the like) in between. In alternative embodiments, the additional circuits may be further disposed between the source line/bit line driving circuit 306 and the additional word line driving circuits 308, 310. Further, the additional word line driving circuits 308, 310 may or may not be overlapped with the three-dimensional memory device 10. Although not shown, some of the word lines 104 in each stack may be routed to the word line driving circuits 302, 304 by the word line routings WR1, WR2, and others of the word lines 104 in each stack may be routed to the additional word line driving circuits 308, 310 by additional word line routings. As a result, an amount of the word line routings connected to each of the word line driving circuits 302, 304, 308, 310 can be further reduced. Since the word line driving circuits 302, 304, 308, 310 are located at different sides of the three-dimensional memory device 10, the laterally extending portions of the word line routings at the same height may share the same metallization layer without being too close to each other.

Figure 6A:
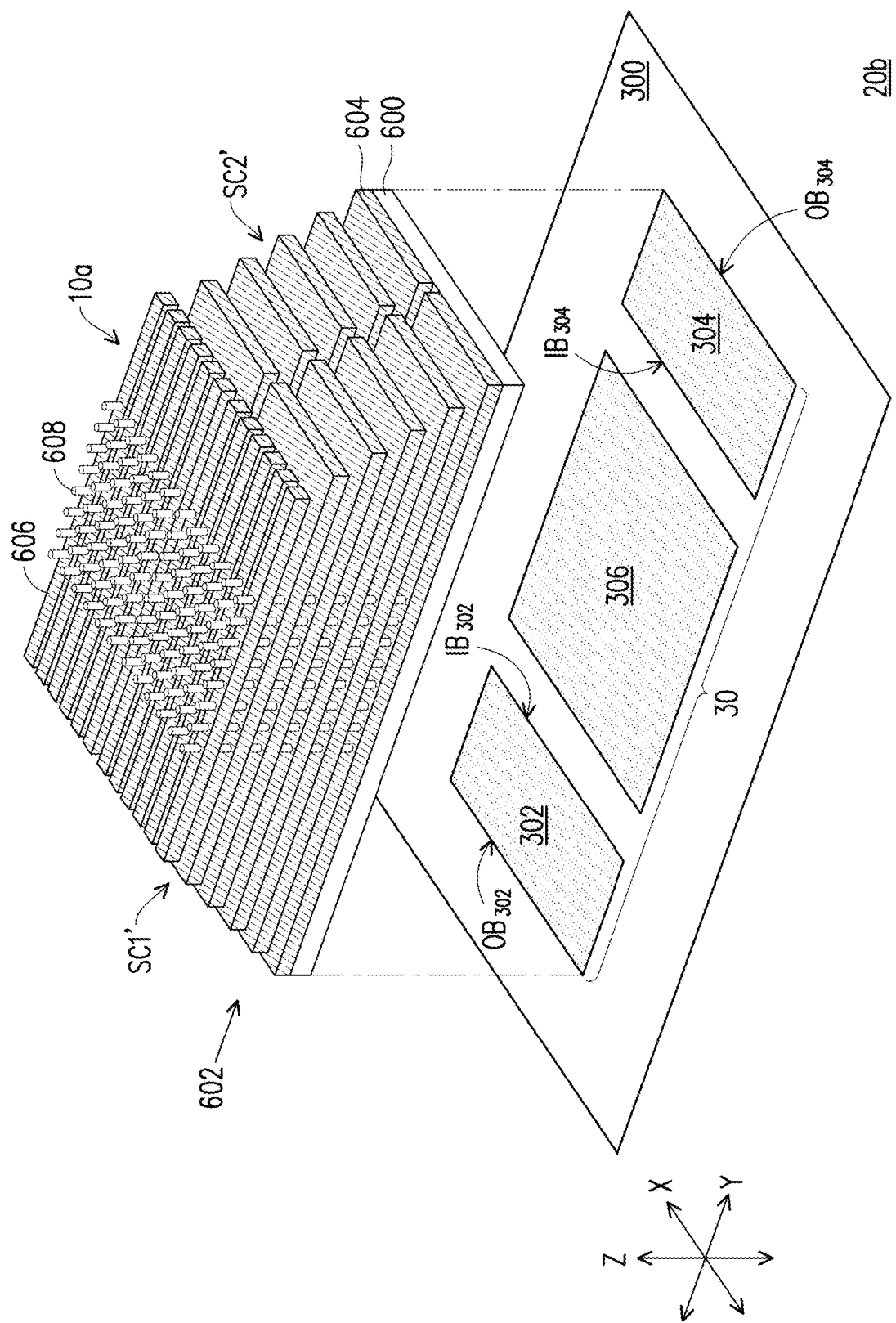
FIG. 6A is a three-dimensional view schematically illustrating applying the driving circuit and the word line routing scheme described with reference to FIG. 3A, 3C, 4A on another three-dimensional memory device, according to some embodiments of the present disclosure.
Figure 6B:
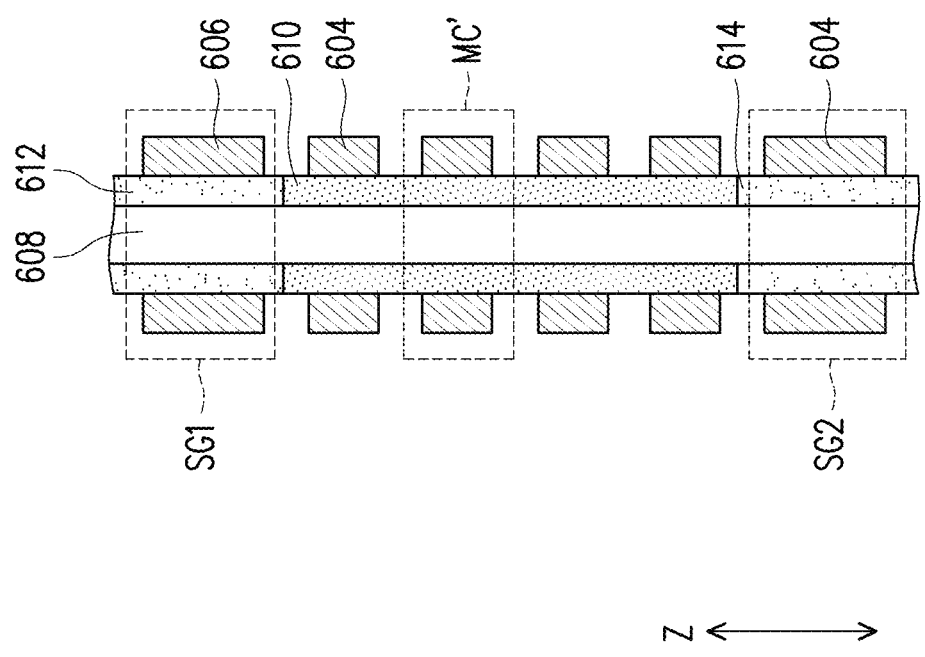
FIG. 6B is a cross-sectional view schematically illustrating a string of memory cells in the three-dimensional memory device 10a as shown in FIG. 6A.

FIG. 6A is a three-dimensional view schematically illustrating applying the driving circuit 30 and the word line routing scheme described with reference to FIG. 3A, 3C, 4A on another three-dimensional memory device 10a, according to some embodiments of the present disclosure. FIG. 6B is a cross-sectional view schematically illustrating a string of memory cells MC' in the three-dimensional memory device 10a as shown in FIG. 6A. An integrated circuit 20b shown in FIG. 6A is similar to the integrated circuit 20 described with reference to FIG. 3A. Only differences between these integrated circuits 20, 20b will be described, the same or the like parts may not be repeated again.

Referring to FIG. 6A, the three-dimensional memory device 10a may include stacking structures 602 formed on a base layer 600. The base layer 600 is similar to the base layer 100 as described with reference to FIG. 1A, and may be an etching stop layer lying over the semiconductor substrate 300. The stacking structures 602 extend along the column direction (i.e., the direction Y) and separately arranged along the row direction (i.e., the direction X). Each stacking structure 602 includes word lines 604 and isolation layers (not shown) alternately stacked along the vertical direction Z. The word lines 604 are similar to the word lines 104 as described with reference to FIG. 1A, but may be thicker (in regarding a dimension along the direction X) than the word lines 104. Similarly, the isolation layers are similar to the isolation layers 106 as described with reference to FIG. 1A, but may be thicker (in regarding a dimension along the direction X) than the isolation layers 106. Further, multiple selection lines 606 are disposed on the word lines 604 in each stacking structure 602. The selection lines 606 extend along the column direction (i.e., the direction Y), and are separately arranged along the row direction (i.e., the direction X). The selection lines 606 may be identical with the word lines 604 in terms of material, but may be narrower (in regarding a dimension along the direction X) than the word lines 604.

A first side of each stacking structure 602 is shaped into a staircase structure SC1', and a second side of each stacking structure 602 is shaped into a staircase structure SC2'. As similar to the staircase structures SC1, SC2 of the stacking structures 102 described with reference to FIG. 2, the word lines 604 in each stacking structure 602 extend to steps of the staircase structures SC1', SC2'. Opposite ends of the selection lines 606 in each stacking structure 602 laterally recess from opposite ends of the topmost word line 604 in the same stacking structure 602, and form the topmost steps of the staircase structures SC1', SC2'. Although not shown, each isolation layer laying below one of the word lines 604 may have opposite ends substantially aligned with opposite ends of this overlying word line 604. Similarly, the isolation layer underlies the selection lines 606 in each stacking structure may have opposite ends substantially aligned with opposite ends of these overlying selection lines 606.

Multiple channel pillars 608 penetrate through the stacking structures 602 along the vertical direction Z, and are located in an array region of the three-dimensional memory device 60 between the staircase structures SC1' and the staircase structures SC2'. The channel pillars 608 may be arranged along columns (extending along the direction Y) and rows (extending along the direction X). In some embodiments, each stacking structure 602 is penetrated by multiple columns of the channel pillars 608 (e.g., 4 to 8 columns of the channel pillars 608). In these embodiments, each selection line 606 in one of the stacking structures 602 is penetrated by a column of the channel pillars 608.

Referring to FIG. 6A and FIG. 6B, each channel pillar 608, which may be formed of a semiconductor material, is surrounded by a stack of the word lines 604 and an overlying selection line 606. A switching layer 610 extends along a sidewall of the channel pillar 608, and separates the channel pillar 608 from the second bottommost one to the topmost one of the surrounding word lines 604. As similar to the switching layer 108 as described with reference to FIG. 1A, the switching layer 610 may be formed of a ferroelectric material, or may be a multilayer structure at least including a charge trapping layer sandwiched between a tunneling dielectric layer and a gate dielectric layer. Each of these word lines 604 (i.e., the second bottommost one to the topmost one of the word lines 604 in a stack), one of the penetrating channel pillars 608 and the switching layer 610 in between may form a storage transistor, which may be referred as a memory cell MC'. In this way, a string of the memory cells MC' are formed along the channel pillar 608. Top and bottom ends of the channel pillar 608 may be functioned as common source and drain terminals of a string of the memory cells MC'. In some embodiments, the top end of each channel pillar 608 is connected to a bit line (not shown), while the bottom end of each channel pillar 608 is connected to a source line/plane (not shown).

In some embodiments, a gate dielectric layer 612 lies between the channel pillar 608 and the surrounding selection line 606. The selection line 606, one of the penetrating channel pillars 608 and the gate dielectric layer 612 in between forms a top selection transistor SG1. The top selection transistor SG1 controls one of the common source/drain terminals of a string of the memory cells MC'. Further, in some embodiments, a gate dielectric layer 614 lies between the channel pillar 608 and the bottommost one of the surrounding word lines 604. The bottommost word line 604, one of the penetrating channel pillars 608 and the gate dielectric layer 614 in between forms a bottom selection transistor SG2. The top selection transistor SG1 controls the other one of the common source/drain terminals of a string of the memory cells MC'. Therefore, the top selection transistor SG1 and the bottom selection transistor SG2 at opposite sides of each channel pillar 608 control access of this channel pillar 608.

Referring to FIG. 6A again, the three-dimensional memory device 10a may be formed over the driving circuit 30, and embedded in a BEOL structure of the integrated circuit 20b, which is similar to the BEOL structure as described with reference to FIG. 3C. The word line driving circuits 302, 304 are configured to drive the word lines 604 in the three-dimensional memory device 10a. The word line driving circuit 302 in the driving circuit 30 extends along a side of the three-dimensional memory device 10a where the stacking structures 602 are shaped into the staircase structures SC1', and the word line driving circuit 304 in the driving circuit 30 extends along another side of the three-dimensional memory device 10a where the stacking structures 602 are shaped into the staircase structures SC2'. In some embodiments, an outer portion of the word line driving circuit 302 rather close to the outer boundary $OB_{302}$ is overlapped with the staircase structures SC1', and an inner portion of the word line driving circuit 302 rather close to the inner boundary $IB_{302}$ is overlapped with the array region of the three-dimensional memory device 10a located between the staircase structures SC1', SC2'. Similarly, an outer portion of the word line driving circuit 304 rather close to the outer boundary $OB_{304}$ is overlapped with the staircase structures SC2', and an inner portion of the word line driving circuit 304 rather close to the inner boundary $IB_{304}$ is overlapped with the array region of the three-dimensional memory device 10a. As similar to the word line routing scheme described with reference to FIGS. 3A, 3C, 4A, some of the word lines 604 in each stacking structure 602 are routed to the word line driving circuit 302 through a staircase structure SC1', while others of the word lines 604 in the same stacking structure 602 are routed to the word line driving circuit 304 through a staircase structure SC2'. In some embodiments, as indicated by the arrows along the word lines 604 in FIG. 6A, the word lines 604 in each stacking structure 602 are alternately routed to the word line driving circuits 302, 304 from its staircase structures SC1, SC2. Although not shown, first word line routings extend between the staircase structures SC1 and the word line driving circuit 302, and second word line routings extend between the staircase structures SC2 and the word line driving circuit 304. Since the first and second word line routings extend at opposite sides of the three-dimensional memory device 10a, laterally extending portions of the first word line routings can share the same metallization layers with laterally extending portions of the second word line routings, while keeping spaced apart from the laterally extending portions of the second word line routings. As a result, an amount of the metallization layers in the BEOL structure can be significantly reduced.

The source line/bit line driving circuit 306 is located between the word line driving circuits 302, 304, and configured to drive the bit lines and/or the source lines/plane (not shown) connected to the channel pillars 608 of the three-dimensional memory device 10a. In some embodiments, a source plane (not shown) is disposed below the base layer 600, while bit lines (also not shown) run above the three-dimensional memory device 10a. In these embodiments, the bit lines may be routed to the source line/bit line driving circuit 306 via a vertical path aside the three-dimensional memory device 10a, as well as lateral and vertical paths running below the three-dimensional memory device 10a and bounded to the source line/bit line driving circuit 306.

In other embodiments, the driving circuit 30a as described with reference to FIG. 5 is applied for driving the three-dimensional memory device 10a as described with reference to FIG. 6A and FIG. 6B, and additional word line routings may be further disposed for connecting the staircase structures SC1', SC2' to the additional word line driving circuits 308, 310.

As described above, the word line routing scheme according to embodiments of the present disclosure includes disposing two word line driving circuits along opposite sides of an overlying three-dimensional memory device where stacking structures in the three-dimensional memory device are shaped into staircase structures. A first group of word lines in a stacking structure are routed to one of the word line driving circuits, and a second group of the word lines in the same stacking structure are routed to another word line driving circuit. First word line routings extending from staircase structures at one side of the three-dimensional memory device are sufficiently spaced apart from second word line routings extending from staircase structures at the other side of the three-dimensional memory device. Therefore, laterally extending portions of the first word line routings and laterally extending portions of the second word line routings can share the same metallization layers while keeping spaced apart from one another. As a result, much less metallization layers are required for the word line routings, and a manufacturing cost can be significantly reduced.

It should be noted that, the word line routing scheme can be applied on various three-dimensional memory devices. The present disclosure merely provides two possible three-dimensional memory devices 10, 10a. However, other three-dimensional memory devices with staircase structures at opposite sides should be available for the word line routing scheme.

In an aspect of the present disclosure, an integrated circuit is provided. The integrated circuit comprises: a three-dimensional memory device, comprising stacking structures separately extending along a column direction, wherein the stacking structures have first staircase structures at a first side of the three-dimensional memory device and second staircase structures at a second side of the three-dimensional memory device; a first word line driving circuit, lying below the three-dimensional memory device and extending along the first side of the three-dimensional memory device, wherein a first group of word lines in each stacking structure are connected to the first word line driving circuit from one of the first staircase structures; and a second word line driving circuit, lying below the three-dimensional memory device and extending along the second side of the three-dimensional memory device, wherein the first and second word line driving circuits are laterally spaced apart from each other, and a second group of the word lines in each stacking structure are connected to the second word line driving circuit from one of the second staircase structures.

In another aspect of the present disclosure, an integrated circuit is provided. The integrated circuit comprises: a three-dimensional memory device, comprising stacking structures separately extending along a column direction, wherein the stacking structures have first staircase structures at a first side of the three-dimensional memory device and second staircase structures at a second side of the three-dimensional memory device; a first word line driving circuit, lying below the three-dimensional memory device and overlapped with the first staircase structures; first word line routings, extending from the first staircase structures to the first word line driving circuit, wherein a first group of word lines in each stacking structure are connected to the first word line driving circuit from one of the first staircase structures by a portion of the first word line routings; a second word line driving circuit, lying below the three-dimensional memory device and overlapped with the second staircase structures; and second word line routings, extending from the second staircase structures to the second word line driving circuit, wherein a second group of the word lines in each stacking structure are connected to the second word line driving circuit from one of the second staircase structures by a portion of the second word line routings.

In yet another aspect of the present disclosure, an integrated circuit is provided. The integrated circuit comprises: a semiconductor substrate; a first word line driving circuit and a second word line driving circuit, formed on the semiconductor substrate, and laterally spaced apart from each other; and a three-dimensional memory device, formed over the first and second word line driving circuits, and comprising stacking structures separately extending along a column direction, wherein a first group of word lines in each stacking structure are connected to the first word line driving circuit, and a second group of word lines in each stacking structure are connected to the second word line driving circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a three-dimensional memory device, comprising stacking structures separately extending along a column direction, wherein the stacking structures have first staircase structures at a first side of the three-dimensional memory device and second staircase structures at a second side of the three-dimensional memory device;
   switching layers and channel layers, extending in between the stacking structures, and covering sidewalls of the stacking structures;
   conductive pillars, standing in between the stacking structures, and in lateral contact with the stacking structures through the switching layers and the channel layers;
   a first word line driving circuit, lying below the three-dimensional memory device and extending along the first side of the three-dimensional memory device, wherein a first group of word lines in each stacking structure are connected to the first word line driving circuit from one of the first staircase structures; and
   a second word line driving circuit, lying below the three-dimensional memory device and extending along the second side of the three-dimensional memory device, wherein the first and second word line driving circuits are laterally spaced apart from each other, and a second group of the word lines in each stacking structure are connected to the second word line driving circuit from one of the second staircase structures.

2. The integrated circuit according to claim 1, wherein the word lines in each stacking structure are alternately connected to the first word line driving circuit and the second word line driving circuit.

3. The integrated circuit according to claim 1, wherein a length of the first word line driving circuit measured along a row direction intersected with the column direction is substantially equal to a length of the three-dimensional memory device measured along the row direction, and a length of the second word line driving circuit measured along the row direction is substantially equal to the length of the three-dimensional memory device as well.

4. The integrated circuit according to claim 1, wherein the first staircase structures are entirely overlapped with the first word line driving circuit, and the second staircase structures are entirely overlapped with the second word line driving circuit.

5. The integrated circuit according to claim 1, wherein
an outer boundary of the first word line driving circuit along a row direction intersected with the column direction is substantially aligned with an outer boundary of the first staircase structures along the row direction, and
an outer boundary of the second word line driving circuit along the row direction is substantially aligned with an outer boundary of the second staircase structures along the row direction.

6. The integrated circuit according to claim 5, wherein
the first word line driving circuit spans along the column direction from the outer boundary of the first word line driving circuit by a width greater than a width by which the first staircase structures span along the column direction from the outer boundary of the first staircase structures, and
the second word line driving circuit spans along the column direction from the outer boundary of the second word line driving circuit by a width greater than a width by which the second staircase structures span along the column direction from the outer boundary of the second staircase structures.

7. The integrated circuit according to claim 6, wherein
an outer portion of the first word line driving circuit is overlapped with the first staircase structures, and an inner portion of the first word line driving circuit is overlapped with an array region of the three-dimensional memory device that is located between the first staircase structures and the second staircase structures, and
an outer portion of the second word line driving circuit is overlapped with the second staircase structures, and an inner portion of the second word line driving circuit is overlapped with the array region of the three-dimensional memory device.

8. The integrated circuit according to claim 1, further comprising:
a third word line driving circuit, extending along the column direction below the three-dimensional memory device, and located at a third side of the three-dimensional memory device; and
a fourth word line driving circuit, extending along the column direction below the three-dimensional memory device, and located at a fourth side of the three-dimensional memory device.

9. The integrated circuit according to claim 8, wherein a third group of the word lines in each stacking structure are routed to the third word line driving circuit, and a fourth group of the word lines in each stacking structure are routed to the fourth word line driving circuit.

10. An integrated circuit, comprising:
a three-dimensional memory device, comprising stacking structures separately extending along a column direction, wherein the stacking structures have first staircase structures at a first side of the three-dimensional memory device and second staircase structures at a second side of the three-dimensional memory device;
a first word line driving circuit, lying below the three-dimensional memory device and overlapped with the first staircase structures;
first word line routings, extending from the first staircase structures to the first word line driving circuit, wherein a first group of word lines in each stacking structure are connected to the first word line driving circuit from one of the first staircase structures by a portion of the first word line routings;
a second word line driving circuit, lying below the three-dimensional memory device and overlapped with the second staircase structures; and
second word line routings, extending from the second staircase structures to the second word line driving circuit, wherein a second group of the word lines in each stacking structure are connected to the second word line driving circuit from one of the second staircase structures by a portion of the second word line routings,
wherein a group of the first word line routings connect the first group of word lines in each stacking structure to first transistors arranged along the column direction in the first word line driving circuit, and a group of the second word line routings connect the second group of word lines in each stacking structure to second transistors arrange along the column direction in the second word line driving circuit.

11. The integrated circuit according to claim 10, wherein
a lower part of each first word line routing is located below the three-dimensional memory device, and has a laterally extending portion running along the column direction, and the laterally extending portions of the first word line routings extending from the same stacking structure are vertically spaced apart from one another; and
a lower part of each second word line routing is located below the three-dimensional memory device, and has a laterally extending portion running along the column direction, and the laterally extending portions of the second word line routings extending from the same stacking structure are vertically spaced apart from one another.

12. The integrated circuit according to claim 11, wherein the laterally extending portion of one of the first word line routings extending from one of the stacking structures is at the same horizontal level with the laterally extending portion of one of the second word line routings extending from the one of the stacking structures.

13. The integrated circuit according to claim 11, wherein the laterally extending portions of the first word line routings are laterally spaced apart from the laterally extending portions of the second word line routings, and at least partially located at the same horizontal levels as the laterally extending portions of the second word line routings.

14. An integrated circuit, comprising:
a semiconductor substrate;
a first word line driving circuit and a second word line driving circuit, formed on the semiconductor substrate, and laterally spaced apart from each other;
a three-dimensional memory device, formed over the first and second word line driving circuits, and comprising stacking structures separately extending along a column direction, wherein a first group of word lines in each stacking structure are connected to the first word line driving circuit, and a second group of word lines in each stacking structure are connected to the second word line driving circuit; and
source lines/bit lines, disposed over or below the three-dimensional memory device, and extending along a row direction intersected with the column direction, wherein a first group of the source lines/bit lines overlap the first word line driving circuit, and second group of the source lines/bit liens overlap the second word line driving circuit.

15. The integrated circuit according to claim 14, wherein interconnections of the first word line driving circuit, interconnections of the second word line driving circuit, the three-dimensional memory device and the source lines/bit lines are embedded in a back-end-of-line (BEOL) structure formed on the semiconductor substrate.

16. The integrated circuit according to claim 15, wherein first word line routings connecting the first group of the word lines in each stacking structure to the first word line driving circuit and second word line routings connecting the second group of the word lines in each stacking structure are embedded in the BEOL structure.

17. The integrated circuit according to claim 16, wherein the first word line routings have laterally extending portions running below the three-dimensional memory device, the second word line routings have laterally extending portions running below the three-dimensional memory device, and the laterally extending portions of the first word line routings and the laterally extending portions of the second word line routings share metallization layers in the BEOL structure.

18. The integrated circuit according to claim 14, wherein the stacking structures have first staircase structures at a first side of the three-dimensional memory device, and have second staircase structures at a second side of the three-dimensional memory device.

19. The integrated circuit according to claim 18, wherein
the first word line driving circuit extends along the first side of the three-dimensional memory device, and is overlapped with the first staircase structures, and
the second word line driving circuit extends along the second side of the three-dimensional memory device, and is overlapped with the second staircase structures.

20. The integrated circuit according to claim 14, wherein the word lines in each stacking structure are stacked along a vertical direction, and are vertically spaced apart from one another.

* * * * *